(12) United States Patent
Lai et al.

(10) Patent No.: US 10,431,774 B2
(45) Date of Patent: Oct. 1, 2019

(54) DISPLAY UNIT, METHOD FOR MANUFACTURING THE SAME AND ARRAY SUBSTRATE

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Weilin Lai, Beijing (CN); Yan Fan, Beijing (CN); Chenxi Lv, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/984,296

(22) Filed: May 18, 2018

(65) Prior Publication Data
US 2019/0165317 A1     May 30, 2019

(30) Foreign Application Priority Data

Nov. 27, 2017 (CN) .......................... 2017 1 1205880

(51) Int. Cl.
*H01L 27/32* (2006.01)
*H01L 51/52* (2006.01)
*H01L 51/56* (2006.01)

(52) U.S. Cl.
CPC ...... *H01L 51/5265* (2013.01); *H01L 27/3211* (2013.01); *H01L 27/3248* (2013.01); *H01L 27/3276* (2013.01); *H01L 51/5203* (2013.01); *H01L 51/5212* (2013.01); *H01L 51/5218* (2013.01); *H01L 51/5221* (2013.01); *H01L 51/56* (2013.01); *H01L 2227/323* (2013.01); *H01L 2251/5315* (2013.01); *H01L 2251/558* (2013.01)

(58) Field of Classification Search
CPC ....................................................... H01L 27/30
See application file for complete search history.

(56) References Cited

U.S. PATENT DOCUMENTS

2018/0122875 A1\* 5/2018 Bang .................... H01L 51/5212
2018/0151643 A1\* 5/2018 Lee ........................ H01L 27/322

\* cited by examiner

*Primary Examiner* — Cheung Le
(74) *Attorney, Agent, or Firm* — Kinney & Lange, P.A.

(57) ABSTRACT

The present disclosure provides a display unit and a method for manufacturing the display unit, and an array substrate. The display unit includes a first electrode; a second electrode opposite to the first electrode; and a passivation layer, an auxiliary electrode and a light emitting functional layer between the first electrode and the second electrode, the passivation layer, the auxiliary electrode and the light emitting functional layer being disposed from the first electrode to the second electrode in sequence. The first electrode is electrically connected to the auxiliary electrode. One of the first electrode and the second electrode is transflective while the other one of the first electrode and the second electrode is transflective or reflective, and a first cavity is formed between the first electrode and the second electrode.

18 Claims, 4 Drawing Sheets

DISPLAY UNIT, METHOD FOR MANUFACTURING THE SAME AND ARRAY SUBSTRATE

CROSS-REFERENCE TO RELATED APPLICATION

This application claims the priority benefit of the Chinese Patent Application No. 201711205880.6 filed on Nov. 27, 2017 in the State Intellectual Property Office of China, the whole disclosure of which is incorporated herein by reference.

BACKGROUND

Technical Field

The present disclosure relates to the field of display technology, and in particular, to a display unit and a method for manufacturing the display unit, and an array substrate.

Description of the Related Art

In the field of display technology, electroluminescent display devices have advantages such as being self-luminous, being ultra-thin, and having high response speed, high color gamut, wide viewing angle, low power consumption, etc., and can be widely used in advertising screens, large-size televisions, flexible mobile phones and the like.

SUMMARY

An embodiment of the present disclosure provides a display unit comprising: a first electrode; a second electrode opposite to the first electrode; and a passivation layer, an auxiliary electrode and a light emitting functional layer between the first electrode and the second electrode, the passivation layer, the auxiliary electrode and the light emitting functional layer being disposed from the first electrode to the second electrode in sequence, wherein the first electrode is electrically connected to the auxiliary electrode, and wherein one of the first electrode and the second electrode is transflective while the other one of the first electrode and the second electrode is transflective or reflective, and a first cavity is formed between the first electrode and the second electrode.

In some embodiments, the auxiliary electrode comprises a third electrode which is transflective; and a second cavity is formed between the first electrode and the third electrode, and a third cavity is formed between the second electrode and the third electrode.

In some embodiments, a cavity length of the second cavity is adjusted by adjusting a thickness of the passivation layer, and a cavity length of the third cavity is adjusted by adjusting a thickness of the light emitting functional layer.

In some embodiments, the light emitting functional layer comprises: a hole injection layer, a hole transport layer and an electroluminescent layer, the hole injection layer, the hole transport layer and the electroluminescent layer being disposed from the first electrode to the second electrode in sequence; and the cavity length of the third cavity is adjusted by adjusting a thickness of the hole transport layer and/or a thickness of the hole injection layer.

In some embodiments, the third electrode is made of a material having a work function of 4 electron volts or more.

In some embodiments, a thickness of the third electrode is equal to or less than 200 Å.

In some embodiments, the auxiliary electrode further comprises a first transparent electrode, the first transparent electrode and the third electrode being stacked on each other and electrically connected to each other, and the first transparent electrode is disposed between the third electrode and the passivation layer, and the first transparent electrode is electrically connected to the first electrode, or the third electrode is disposed between the first transparent electrode and the passivation layer, and the third electrode is electrically connected to the first electrode.

In some embodiments, a cavity length of the first cavity is adjusted by adjusting a thickness of the passivation layer and/or a thickness of the light emitting functional layer.

In some embodiments, the light emitting functional layer comprises: a hole injection layer, a hole transport layer and an electroluminescent layer, the hole injection layer, the hole transport layer and the electroluminescent layer being disposed from the first electrode to the second electrode in sequence; and a cavity length of the first cavity is adjusted by adjusting a thickness of the hole transport layer and/or a thickness of the hole injection layer.

In some embodiments, the first electrode is reflective, the first electrode comprises a second transparent electrode and a reflective electrode, the second transparent electrode and the reflective electrode being stacked on each other and electrically connected to each other, and the reflective electrode is disposed between the passivation layer and the second transparent electrode.

In some embodiments, a via hole penetrating the passivation layer is provided in the passivation layer, and the auxiliary electrode is electrically connected to the first electrode through the via hole.

An embodiment of the present disclosure provides an array substrate comprising: a base substrate; a plurality of display units as described above on the base substrate, and a plurality of pixel circuits on the base substrate and electrically connected to the first electrodes of the plurality of display units, respectively.

In some embodiments, the plurality of display units comprise: at least two groups of display units, thicknesses of light emitting functional layers of the display units in different groups are different, and thicknesses of passivation layers of the display units in different groups are identical or different.

An embodiment of the present disclosure provides a method for manufacturing a display unit, comprising: forming a passivation layer, an auxiliary electrode, a light emitting functional layer and a second electrode on a first electrode in sequence; wherein, the first electrode is electrically connected to the auxiliary electrode, and wherein one of the first electrode and the second electrode is transflective while the other one of the first electrode and the second electrode is transflective or reflective, and a first cavity is formed between the first electrode and the second electrode.

In some embodiments, forming the auxiliary electrode comprises: forming a third electrode from a material having a work function of 4 electron volts or more, the third electrode having a thickness of 200 Å or less; a second cavity is formed between the first electrode and the third electrode, and a third cavity is formed between the second electrode and the third electrode.

In some embodiments, forming the auxiliary electrode further comprises: forming a first transparent electrode and the third electrode sequentially on the passivation layer, the first transparent electrode being electrically connected to the first electrode, or forming a third electrode and a first transparent electrode sequentially on the passivation layer, the third electrode being electrically connected to the first electrode.

In some embodiments, forming the light emitting function layer comprises: forming a hole injection layer, a hole transport layer and an electroluminescent layer on the auxiliary electrode in sequence.

In some embodiments, after forming the passivation layer and before forming the auxiliary electrode, the method further comprises: forming a via hole penetrating the passivation layer in the passivation layer.

BRIEF DESCRIPTION OF THE DRAWINGS

In order to more clearly describe technical solutions of embodiments of the present disclosure, drawings used in descriptions of the embodiments will be briefly described below. It is obvious that the drawings in the following description are only some embodiments of the present disclosure. For those skilled in the art, other drawings may also be obtained based on these drawings without any creative work.

DETAILED DESCRIPTION OF PREFERRED EMBODIMENTS

To make the purposes, technical solutions, and advantages of the present disclosure more clear, implementations of the present disclosure will be further described in detail with reference to accompanying drawings.

Electroluminescent display devices such as an OLED (Organic Light Emitting Diode) display device and a QLED (Quantum Dot Light Emitting Diode) display device have advantages such as being self-luminous, being ultra-thin, and having high response speed, high color gamut, wide viewing angle, and low power consumption, so that they can be widely used in advertising screens, large-size televisions, and flexible mobile phones, etc.

Figure 1:
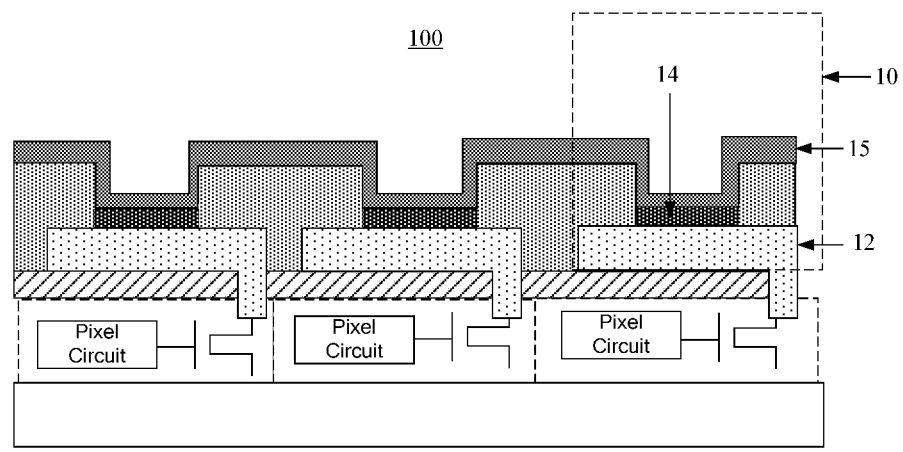
FIG. 1 is a schematic structural view of an array substrate provided by the related art.

Taking the OLED display device as an example, the OLED display device includes an array substrate capable of emitting light, and the array substrate includes a plurality of OLED display units. FIG. 1 is a schematic structural view of an OLED array substrate in the related art. As shown in FIG. 1, the OLED array substrate 100 includes OLED display units 10. Three OLED display units 10 are shown. The three OLED display units 10 includes a red OLED display unit for emitting red light, a green OLED display unit for emitting green light, and a blue OLED display unit for emitting blue light. The OLED display units of three colors are combined so that the OLED array substrate emits colored light for color display.

The OLED display unit 10 includes a bottom electrode 12, an organic light emitting functional layer 14, and a top electrode 15 stacked in sequence. The organic light emitting functional layer 14 includes at least an emitting layer. When a voltage is applied between the bottom electrode 12 and the top electrode 15, the organic light emitting functional layer 14 between the bottom electrode 12 and the top electrode 15 emits light, for example, red light, green light, or blue light.

In the related art, for example, the OLED display unit 10 is a top-emitting OLED display unit, the bottom electrode 12 is made of a material with a high reflectivity, and the top electrode 15 is made of a transflective material. In this way, a cavity is formed between the bottom electrode 12 and the top electrode 15. Light emitted from the organic light emitting functional layer 14 is reflected between the bottom electrode 12 and the top electrode 15 and finally emitted through the top electrode 15. The Applicant has found that brightness and chrominance of monochromatic light emitted by the OLED display unit are related to a cavity length. In order to achieve a better display effect, the cavities of the three color OLED display units on the OLED array substrate need to be set with respective predetermined cavity lengths.

The Applicant has found that, the cavity length is adjusted to a predetermined cavity length generally by adjusting a thickness of the organic light emitting functional layer in the related art. For the OLED display unit having a large predetermined cavity length, a thick organic light emitting functional layer needs to be provided during manufacturing. The organic light emitting functional layer has a slow deposition rate and is expensive in material, so that the manufacturing efficiency of the OLED display device is low, and the cost is high. Other types of electroluminescent display devices also have such problems.

In order to overcome the above problems, the present disclosure provides a display unit including a first electrode and a second electrode, the second electrode being opposite to the first electrode. The display unit further includes a passivation layer, an auxiliary electrode, and a light emitting functional layer. The passivation layer, the auxiliary electrode, and the light emitting functional layer are disposed between the first electrode and the second electrode from the first electrode to the second electrode in that order. The first electrode and the auxiliary electrode are electrically connected. One of the first electrode and the second electrode is transflective and the other one is transflective or reflective. A first cavity is formed between the first electrode and the second electrode. The passivation layer is additionally provided between the first electrode and the second electrode, thereby forming a cavity with a large cavity length. The passivation layer has a fast deposition rate and low cost, thereby improving the manufacture efficiency of the display unit and the display device and reducing cost.

In order to more clearly describe the present disclosure, contents of the present disclosure will be explained by taking an OLED display unit as an example in the description of the following embodiments. Those skilled in the art should understand that other types of electroluminescent units are also protected by the present disclosure.

Figure 2:
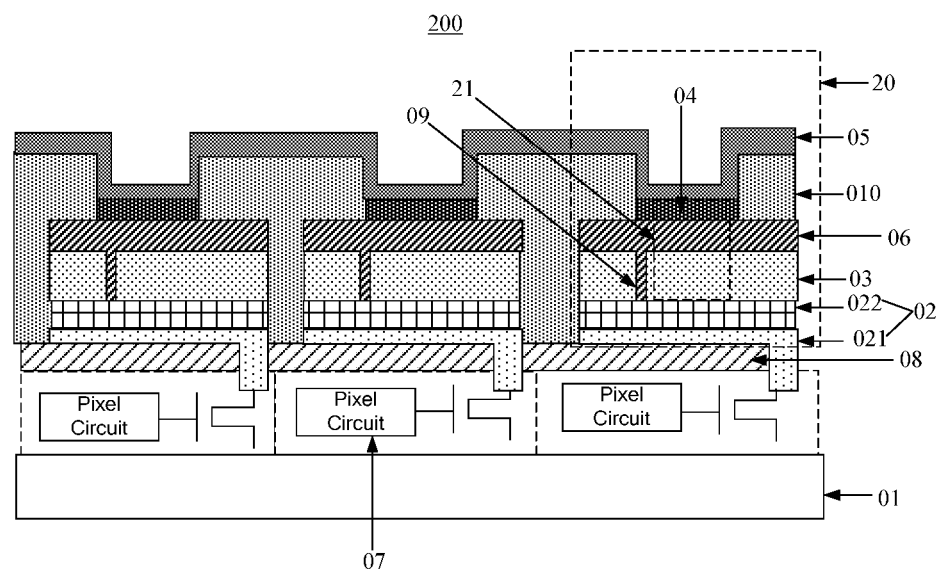
FIG. 2 is a schematic structural view of an array substrate provided by an embodiment of the present disclosure.

FIG. 2 is a schematic structural view of an array substrate provided by an embodiment of the present disclosure. The array substrate is an OLED array substrate. As shown in FIG. 2, the array substrate 200 may include a base substrate (e.g., a glass substrate) 01 and a plurality of OLED display units 20 on the base substrate 01.

Each of the OLED display units 20 includes a first electrode 02, a passivation layer 03, an auxiliary electrode 06, an organic light emitting functional layer 04 and a second electrode 05 disposed far from the base substrate 01 in that order. The passivation layer 03 is provided with a via hole 09. The first electrode 02 and the auxiliary electrode 06 are electrically connected through the via hole 09. The first electrode 02 and the second electrode 05 are capable of reflecting light, and the auxiliary electrode 06 is capable of transmitting light, for example, the auxiliary electrode 06 is a transparent electrode. At least one of the first electrode 02 and the second electrode 05 is made of a transflective material. For example, the second electrode 05 is made of the transflective material, and the first electrode 02 is made of a reflective material. In such a case, the OLED display unit 20 is a top-emitting display unit. A first cavity 21 is formed between the first electrode 02 and the second electrode 05. A cavity length of the first cavity 21 is related to brightness and chrominance of monochromatic light emitted by the OLED display unit 20.

In the OLED array substrate provided by this embodiment, the passivation layer 03 is disposed between the first electrode 02 and the second electrode 05. Therefore, the cavity length of the first cavity 21 may be adjusted by adjusting a thickness of the organic light emitting functional layer 04 so as to implement a large predetermined cavity length of the first cavity 21. Also, the cavity length of the first cavity 21 may be adjusted by adjusting a thickness of the passivation layer 03 so as to implement a large predetermined cavity length of the first cavity 21. Since a speed for manufacturing the passivation layer are generally fast, the thickness of the organic light emitting functional layer that needs to be formed is reduced while the large predetermined cavity length of the first cavity 21 is implemented. Thus, the efficiency of manufacturing the OLED array substrate and the OLED display device is improved. Further, since the material for manufacturing the passivation layer is lower in cost than the material for manufacturing the organic light emitting functional layer, the manufacturing cost can be reduced.

In an embodiment of the present disclosure, at least one of the first electrode 02 and the second electrode 05 is made of a transflective material. Exemplarily, the first electrode 02 is made of the transflective material, the second electrode 05 is made of a reflective material, and the second electrode 05 has a higher reflectivity than the first electrode 02. In such a case, the OLED display unit 20 is a bottom-emitting display unit. Alternatively, the second electrode 05 is made of the transflective material, the first electrode 02 is made of a reflective material, and the first electrode 02 has a higher reflectivity than the second electrode 05. In such a case, the OLED display unit 20 is a top-emitting display unit. The reflective material may be a reflective metal (e.g., silver, copper, etc.).

Three OLED display units 20 are shown in FIG. 2. The three OLED display units emit red light, green light, and blue light respectively. The three OLED display units constitute one pixel unit on the OLED array substrate so that colored light may be emitted from the pixel unit. The OLED array substrate includes a plurality of pixel units to realize color display. The first cavities of the three color OLED display units are set with respective predetermined cavity lengths, so that brightness and chrominance of monochromatic light emitted by the OLED display units of different colors are good. Thus the OLED array substrate can achieve better display.

Figure 3:
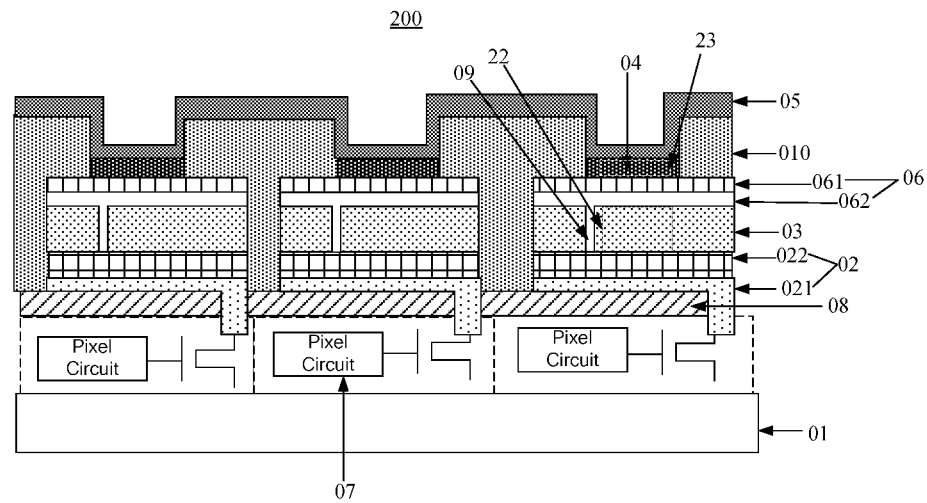
FIG. 3 is a schematic structural view of an array substrate provided by another embodiment of the present disclosure.

FIG. 3 is a schematic structural view of an array substrate provided by another embodiment of the present disclosure. As shown in FIG. 3, on the basis of FIG. 2, an auxiliary electrode 06 of an OLED display unit 200 may include a third electrode 061. The third electrode 061 may be made of a transflective material, such as transflective metal.

The transflective third electrode 061 is disposed between the first electrode 02 and the second electrode 05, so that a second cavity 22 is formed between the third electrode 061 and the first electrode 02 and a third cavity 23 is formed between the electrode 061 and the second electrode 05. A combination of the second cavity and the third cavity may be similar to the first cavity in the previous embodiment. As shown in FIG. 3, in the second cavity 22, the passivation layer serves as a light transmission medium, i.e., a first transmission medium. In the third cavity 23, the organic light emitting functional layer serves as a light transmission medium, i.e., a second transmission medium. Because of different materials, the first transmission medium and the second transmission medium have different light transmission characteristics. Compared with both the first transmission medium and the second transmission medium are disposed in the first cavity 21 in the previous embodiment, a structure of double-cavities combination in the present embodiment may obtain a better light emitting effect. A cavity length of the combined cavity is related to brightness and chrominance of monochromatic light emitted by the OLED display unit. The cavity length of the second cavity 22 may be adjusted by adjusting a thickness of the passivation layer 03, and the cavity length of the third cavity 23 may be adjusted by adjusting a thickness of the organic light emitting functional layer 04, thereby achieving a large predetermined cavity length of the combined cavity. In order to realize the predetermined cavity length of the combined cavity in the OLED array substrate, the cavity length of at least one of the second cavity 22 and the third cavity 23 may be adjusted. For example, the thickness of the passivation layer 03 may be increased as much as possible, thereby improving the manufacturing efficiency of the OLED display unit and reducing the cost.

With continued reference to FIG. 3, the auxiliary electrode 06 of the OLED display unit may further include a first transparent electrode 062, such as ITO, etc. The first transparent electrode 062 is disposed between the third electrode 061 and the passivation layer 03, and is electrically connected to the third electrode 061. In this case, the first transparent electrode 062 is electrically connected to the first electrode 02 through the via hole 09 in the passivation layer 03.

Figure 4:
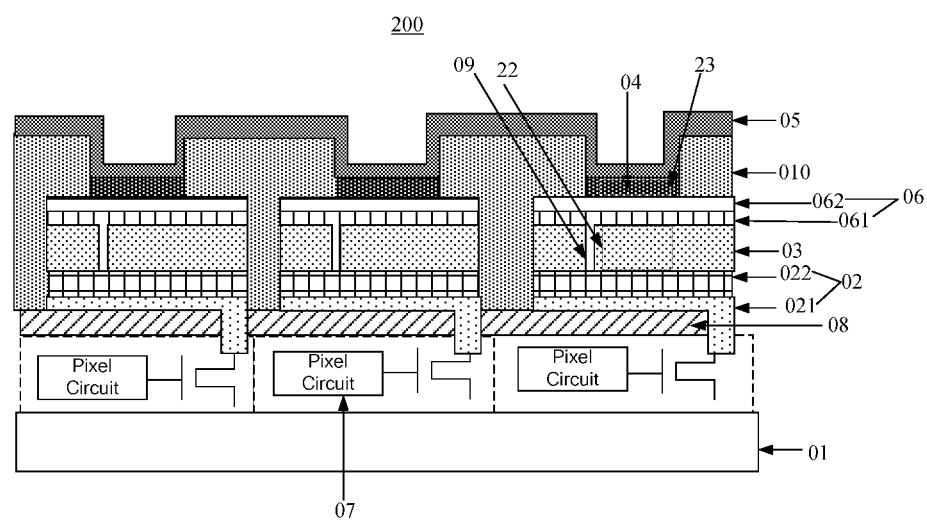
FIG. 4 is a schematic structural view of an array substrate provided by still another embodiment of the present disclosure.

In an alternative embodiment, FIG. 4 is a schematic structural view of an array substrate provided by still another embodiment of the present disclosure. As shown in FIG. 4, in the OLED display unit 200, a relative position of the third electrode 061 and the first transparent electrode 062 may be different from a relative position thereof in FIG. 3. As shown in FIG. 4, the first transparent electrode 062 may be disposed between the third electrode 061 and the organic light emitting functional layer 04, and is electrically connected with the third electrode 061. In this case, the third electrode 061 is electrically connected to the first electrode 02 through the via hole 09 in the passivation layer 03.

The third electrode 061 is made of a material having a work function of 4 electron volts or more, such as silver, aluminum, gold, copper, plumbum, tin, chromium, molybdenum, tungsten, nickel, titanium, beryllium, cadmium, carbon, cobalt, palladium, or iron. A thickness of the third electrode 061 is less than or equal to 200 angstroms, which ensures both a conductive characteristic and a transflective characteristic of the third electrode 061.

In some embodiments, the first transparent electrode 062 may be omitted and the third electrode 061 may serve as the auxiliary electrode.

In an embodiment, in the OLED display units shown in FIG. 2, FIG. 3, and FIG. 4, the first electrode 02 having a reflective characteristic includes a second transparent electrode 021, such as ITO or the like, and a reflective electrode 022, such as silver, copper or the like. The second transparent electrode 021 and the reflective electrode 022 are stacked on each other and electrically connected to each other. The second transparent electrode 021 is disposed between the reflective electrode 022 and the passivation layer 03. In an alternative embodiment, the reflective electrode 022 is disposed between the second transparent electrode 021 and the passivation layer 03.

In an embodiment, the second transparent electrode 021 may be omitted and the reflective electrode 022 may serve as the first electrode.

Figure 5:
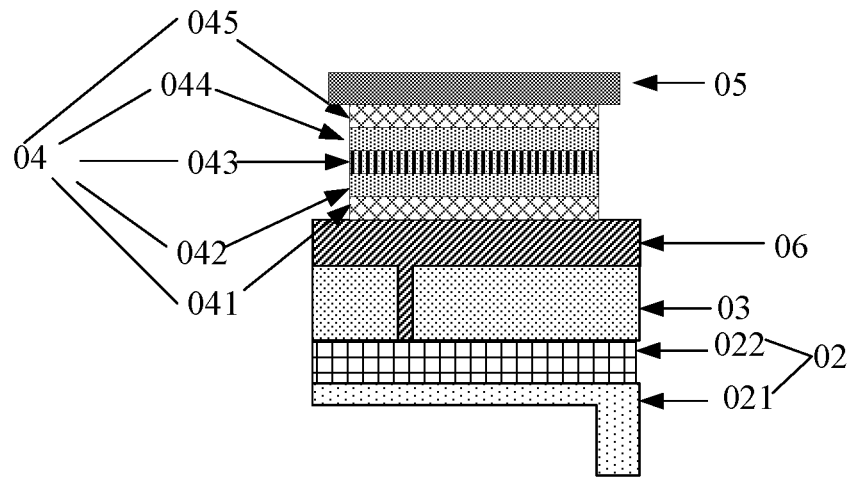
FIG. 5 is a schematic structural view of an OLED display unit provided by an embodiment of the present disclosure.

FIG. 5 is a schematic structural view of an OLED display unit in an embodiment of the present disclosure. As shown in FIG. 5, the organic light emitting functional layer 04 includes a hole injection layer 041, a hole transport layer 042, an organic emitting layer 043, an electron injection layer 044, and an electron transport layer 045 disposed away from the passivation layer 03 in that order. In this case, the first electrode 02 is an anode, and the second electrode 05 is a cathode. In order to adjust the thickness of the organic light emitting functional layer 04, a thickness of at least one of the hole injection layer 041, the hole transport layer 042, the organic light emitting layer 043, the electron injection layer 044 and the electron transport layer 045 can be adjusted, for example, thicknesses of the hole injection layer 041 and/or the hole transport layer 042 may be adjusted.

An embodiment of the present disclosure provides an OLED array substrate. As shown in FIG. 2 to FIG. 4, the OLED array substrate 200 includes a base substrate 01 and a plurality of OLED display units 20 on the base substrate 01 and a plurality of pixel circuits 07 on the base substrate 01. Each of the OLED display units 20 may have the structure of the display unit in the foregoing embodiments. Each of the pixel circuits 07 is connected to one OLED display unit 20 to provide an electrical signal to the first electrode 02 of the OLED display unit 20.

Three OLED display units are shown in FIG. 2 to FIG. 4. The three OLED display units includes a red OLED display unit for emitting red light, a green OLED display unit for emitting green light and a blue OLED display unit for emitting blue light. The three OLED display units constitute one pixel unit on the OLED array substrate, so that the pixel unit can emit colored light. The OLED array substrate includes a plurality of pixel units to realize color display. The cavity lengths of the cavities of the OLED display unit of three colors are adjusted to the predetermined cavity lengths respectively, so that the monochromatic light emitted by the OLED display units of various colors has better brightness and chromaticity. Thus the OLED array substrate can realize better display.

The OLED array substrate 200 further includes a planarization layer 08 between the pixel circuit 07 and the first electrode 02 so that the first electrode 02 on the planarization layer 08 is formed on a flat surface. A via hole is provided on the planarization layer 08, and the first electrode 02 can be electrically connected with the pixel circuit 07 through the via hole to receive an electrical signal.

The OLED array substrate 200 further includes a pixel defining layer 010 between any two adjacent OLED display units 20 for dividing sub-pixels in the pixel units.

In the OLED array substrate 200, the passivation layer 03 is disposed between the first electrode 02 and the second electrode 05. Therefore, the cavity length of the first cavity or the combined cavity of the OLED display unit may be adjusted by adjusting the thickness of the organic light emitting functional layer 04 and/or the thickness of the passivation layer 03, so as to implement a large predetermined cavity length of the first cavity or the combined cavity. Since a speed for manufacturing the passivation layer are generally fast, the thickness of the organic light emitting functional layer that needs to be formed is reduced while the large predetermined cavity length of the first cavity or the combined cavity is implemented. Thus, the efficiency of manufacturing the OLED array substrate and the OLED display device is improved. Further, since the material for manufacturing the passivation layer is lower in cost than the material for manufacturing the organic light emitting functional layer, the manufacturing cost can be reduced.

The present disclosure also provides a display device including the OLED array substrate in the foregoing embodiments.

Figure 6:
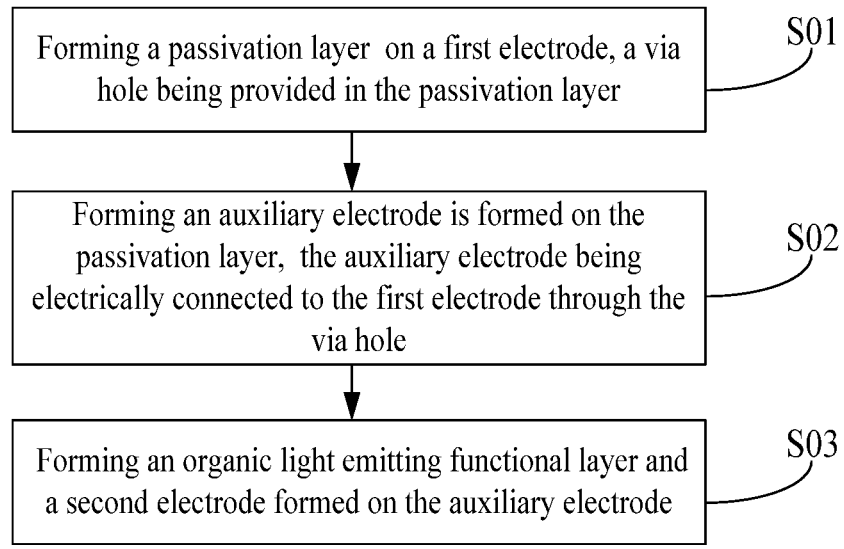
FIG. 6 is a flow chart of a method for manufacturing an OLED display unit provided by an embodiment of the present disclosure.

FIG. 6 is a flow chart of a method for manufacturing an OLED display unit according to an embodiment of the present disclosure. As shown in FIG. 6, the method for manufacturing an OLED display unit may include the following steps.

In a step S01, a passivation layer is formed on the first electrode, and a via hole is provided in the passivation layer.

Figure 7:
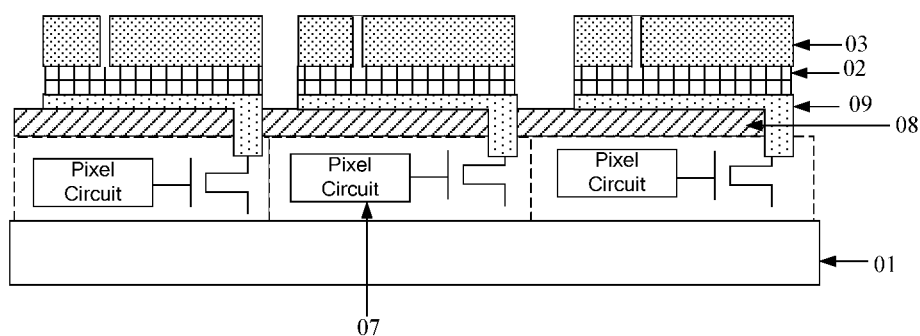
FIG. 7 and FIG. 8 are schematic structural views of an array substrate formed after performing each step of the method in FIG. 6.

A passivation material layer is formed on the first electrode 02, and then the passivation material layer may be etched to form a via hole 09 in the passivation material layer, so as to obtain a passivation layer 03 with a via hole 09. After step S01 is performed, a structure of the array substrate is shown in FIG. 7.

In a step S02, an auxiliary electrode is formed on the passivation layer, and the auxiliary electrode is electrically connected to the first electrode through the via hole.

Exemplarily, as shown in FIG. 3, the auxiliary electrode 06 may include a third electrode 061 and a first transparent electrode 062 which are stacked on each other and electrically connected to each other. In an embodiment, the first transparent electrode 062 is disposed between the third electrode 061 and the passivation layer 03. In an alternative embodiment, as shown in FIG. 4, the first transparent electrode 062 is disposed between the third electrode 061 and the organic light emitting functional layer 04. Hereinafter, the step S02 will be specifically explained by taking an example in which the first transparent electrode 062 is disposed between the third electrode 061 and the passivation layer.

Figure 8:
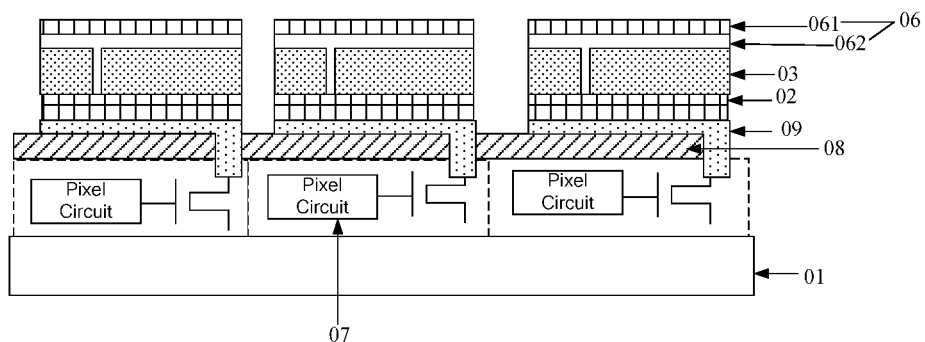

As shown in FIG. 8, in the step S02, the first transparent electrode 062 and the third electrode 061 are sequentially formed on the passivation layer 03. The first transparent electrode 062 is connected to the first electrode 02 through the via hole 09 in the passivation layer 03. The first transparent electrode 062 and the third electrode 061 constitute the auxiliary electrode 06.

In a step S03, an organic light emitting functional layer and a second electrode are sequentially formed on the auxiliary electrode.

In the step S03, the organic light emitting functional layer 04 and the second electrode 05 may be sequentially formed on the third electrode 061 of the auxiliary electrode 06 to obtain the OLED display unit of the array substrate as shown in FIG. 3. The first cavity or the combined cavity by combining the second cavity with the third cavity is formed between the first electrode 02 and the second electrodes 05. The second electrode 05 is in electrical contact with the organic light emitting functional layer 04. The first electrode 02 is in electrical contact with the organic light emitting functional layer 04 through the via hole 09 in the passivation layer 03 and the auxiliary electrode 06. The organic light emitting functional layer 04 may be formed through vapor deposition.

An embodiment of the present disclosure further provides a method for manufacturing an OLED array substrate, which includes the above-mentioned method for manufacturing an OLED display unit, further includes: forming pixel circuits 07, a planarization layer 08 and a first electrode 02 on the base substrate 01 in that order.

In an embodiment, prior to the step S03 of the method for manufacturing the OLED display unit, the method for manufacturing the OLED array substrate further includes: forming a pixel defining layer 010 for dividing sub-pixels in the pixel units.

It should be noted that, the methods provided by the embodiments of the present disclosure can be mutually referenced with the corresponding structural embodiments, and embodiments of the present disclosure do not limit thereto. An order of the steps of the methods provided in the embodiments of the present disclosure may be adjusted appropriately, and the steps can also be correspondingly increased or decreased as needed. Those skilled in the art can easily think of changes within technical scope disclosed by the present disclosure. These changes should all be covered by the protection scope of the present disclosure, and therefore will not be described again.

The foregoing descriptions are merely optional embodiments of the present disclosure and are not intended to limit the present disclosure. Any modification, equivalent replacement or improvement made within the spirit and principle of the present disclosure shall be included in the protection of the present disclosure.

What is claimed is:

1. A display unit comprising:
   a first electrode;
   a second electrode opposite to the first electrode; and
   a passivation layer, an auxiliary electrode and a light emitting functional layer between the first electrode and the second electrode, the passivation layer, the auxiliary electrode and the light emitting functional layer being disposed from the first electrode to the second electrode in sequence,
   wherein the first electrode is electrically connected to the auxiliary electrode, and
   wherein one of the first electrode and the second electrode is transflective while the other one of the first electrode and the second electrode is transflective or reflective, and a first cavity is formed between the first electrode and the second electrode.

2. The display unit according to claim 1, wherein the auxiliary electrode comprises a third electrode which is transflective; and
   wherein a second cavity is formed between the first electrode and the third electrode, and a third cavity is formed between the second electrode and the third electrode.

3. The display unit according to claim 2, wherein a cavity length of the second cavity is adjusted by adjusting a thickness of the passivation layer, and a cavity length of the third cavity is adjusted by adjusting a thickness of the light emitting functional layer.

4. The display unit according to claim 3, wherein the light emitting functional layer comprises: a hole injection layer, a hole transport layer and an electroluminescent layer, the hole injection layer, the hole transport layer and the electroluminescent layer being disposed from the first electrode to the second electrode in sequence; and
   wherein, the cavity length of the third cavity is adjusted by adjusting a thickness of the hole transport layer and/or a thickness of the hole injection layer.

5. The display unit according to claim 2, wherein the third electrode is made of a material having a work function of 4 electron volts or more.

6. The display unit according to claim 2, wherein a thickness of the third electrode is equal to or less than 200 Å.

7. The display unit according to claim 2, wherein the auxiliary electrode further comprises a first transparent electrode, the first transparent electrode and the third electrode being stacked on each other and electrically connected to each other, and
   wherein the first transparent electrode is disposed between the third electrode and the passivation layer, and the first transparent electrode is electrically connected to the first electrode, or
   wherein the third electrode is disposed between the first transparent electrode and the passivation layer, and the third electrode is electrically connected to the first electrode.

8. The display unit according to claim 1, wherein a cavity length of the first cavity is adjusted by adjusting a thickness of the passivation layer and/or a thickness of the light emitting functional layer.

9. The display unit according to claim 1, wherein the light emitting functional layer comprises: a hole injection layer, a hole transport layer and an electroluminescent layer, the hole injection layer, the hole transport layer and the electroluminescent layer being disposed from the first electrode to the second electrode in sequence; and
   wherein, a cavity length of the first cavity is adjusted by adjusting a thickness of the hole transport layer and/or a thickness of the hole injection layer.

10. The display unit according to claim 1, wherein the first electrode is reflective, the first electrode comprises a second transparent electrode and a reflective electrode, the second transparent electrode and the reflective electrode being stacked on each other and electrically connected to each other, and
    wherein the reflective electrode is disposed between the passivation layer and the second transparent electrode.

11. The display unit according to claim 1, wherein a via hole penetrating the passivation layer is provided in the passivation layer, and the auxiliary electrode is electrically connected to the first electrode through the via hole.

12. An array substrate comprising:
    a base substrate;
    a plurality of display units according to claim 1 on the base substrate, and
    a plurality of pixel circuits on the base substrate and electrically connected to the first electrodes of the plurality of display units, respectively.

13. The array substrate according to claim 12, wherein the plurality of display units comprise: at least two groups of display units, wherein thicknesses of light emitting functional layers of the display units in different groups are different, and thicknesses of passivation layers of the display units in different groups are identical or different.

14. A method for manufacturing a display unit, comprising:
forming a passivation layer, an auxiliary electrode, a light emitting functional layer and a second electrode on a first electrode in sequence;
wherein, the first electrode is electrically connected to the auxiliary electrode, and
wherein one of the first electrode and the second electrode is transflective while the other one of the first electrode and the second electrode is transflective or reflective, and a first cavity is formed between the first electrode and the second electrode.

15. The method according to claim 14, wherein forming the auxiliary electrode comprises:
forming a third electrode from a material having a work function of 4 electron volts or more, the third electrode having a thickness of 200 Å or less;
wherein a second cavity is formed between the first electrode and the third electrode, and a third cavity is formed between the second electrode and the third electrode.

16. The method according to claim 14, wherein forming the auxiliary electrode further comprises:
forming a first transparent electrode and a third electrode sequentially on the passivation layer, the first transparent electrode being electrically connected to the first electrode, or
forming a third electrode and a first transparent electrode sequentially on the passivation layer, the third electrode being electrically connected to the first electrode.

17. The method according to claim 14, wherein forming the light emitting function layer comprises:
forming a hole injection layer, a hole transport layer and an electroluminescent layer on the auxiliary electrode in sequence.

18. The method according to claim 14, wherein after forming the passivation layer and before forming the auxiliary electrode, the method further comprises:
forming a via hole penetrating the passivation layer in the passivation layer.

* * * * *